US007371023B2

(12) United States Patent
Chan et al.

(10) Patent No.: US 7,371,023 B2
(45) Date of Patent: May 13, 2008

(54) APPARATUS FOR PROCESSING SUBSTRATES AND METHOD THEREFOR

(75) Inventors: Yu-Ying Chan, Miao-Li (TW); Ching-Lung Wang, Miao-Li (TW); Wen-Cheng Hsu, Miao-Li (TW); Tseng-Kui Tseng, Miao-Li (TW); Chen Kun Teng, Miao-Li (TW); Ho-Li Hsieh, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 305 days.

(21) Appl. No.: 11/151,870

(22) Filed: Jun. 13, 2005

(65) Prior Publication Data

US 2005/0274400 A1 Dec. 15, 2005

(51) Int. Cl.
*G03D 5/00* (2006.01)

(52) U.S. Cl. .................................................... 396/611

(58) Field of Classification Search ................ 396/611; 118/52
See application file for complete search history.

(56) References Cited

U.S. PATENT DOCUMENTS 6,159,288 A * 12/2000 Satou et al. .................. 118/70
6,343,882 B1 * 2/2002 Chang et al. ............... 396/611
6,857,795 B2 * 2/2005 Lu et al. ..................... 396/575
7,063,094 B2 * 6/2006 Amai et al. .............. 134/104.1

FOREIGN PATENT DOCUMENTS

SU 574696 * 10/1977
TW 554401 9/2003

* cited by examiner

*Primary Examiner*—D. Rutledge
(74) *Attorney, Agent, or Firm*—Wei Te Chung

(57) ABSTRACT

An apparatus (100) for processing substrates includes: a substrate cleaning device (20), which cleans the substrates with treating liquid; a developing device (40); and a treating liquid recovery system (30), which is connected with the cleaning device and the developing device. The treating liquid recovery system can convey the treating liquid from the cleaning device to the developing device. Thus the treating liquid that has been used in the cleaning device can be reused in the developing device. Therefore the apparatus can economize on treating liquid and reduce costs.

13 Claims, 2 Drawing Sheets

APPARATUS FOR PROCESSING SUBSTRATES AND METHOD THEREFOR

FIELD OF THE INVENTION

The present invention relates to an apparatus for processing substrates and a method for using the apparatus.

BACKGROUND

A typical process in the manufacturing of a liquid crystal display includes the following steps: cleaning a substrate; forming a photoresist; exposing; and developing. An apparatus for processing the substrate during these steps typically uses a treating liquid. In particular, a cleaning device and a developing device of the apparatus use the treating liquid. With large-sized liquid crystal panels now commonplace, the amount of treating liquid needed for processing the corresponding substrates can be considerable.

Referring to FIG. 3, a typical apparatus 10 for processing substrates includes a substrate cleaning device 70 and a treating liquid circulation device 165. The treating liquid circulation device 165 has a drainpipe 140, a treating liquid holding unit 168, a through flowline 166, and a pair of treating liquid providing devices 151, 152. The drainpipe 140 is connected with the substrate cleaning device 70 and the treating liquid holding unit 168. The drainpipe 140 can convey treating liquid that has been used in the substrate cleaning device 70 to the treating liquid holding unit 168. The through flowline 166 is connected with the treating liquid holding unit 168 and with the treating liquid providing devices 151, 152. The through flowline 166 can convey the treating liquid that is held in the treating liquid holding unit 168 to the treating liquid providing devices 151, 152, whereupon such treating liquid can be conveyed to the substrate cleaning device 70 for reuse. The treating liquid circulation device 165 has a mirage trap 142, which is set between the drainpipe 140 and the treating liquid holding unit 168. The mirage trap 142 can remove air bubbles from the treating liquid. The treating liquid circulation device 165 also has a filtering device 167, which is set between the mirage trap 142 and the treating liquid holding unit 168. The filtering device 167 can filter impurities from the treating liquid.

In summary, the apparatus 10 comprises the substrate cleaning device 70, which makes use of recycled treating liquid to clean substrates. This is accomplished by directing used treating liquid form the substrate cleaning device 70 through the treating liquid circulation device 165.

However, in the overall process of manufacturing the liquid crystal panel, the developing process as well as the substrate cleaning process needs treating liquid. The apparatus 10 only recycles treating liquid used in the cleaning substrate process. Treating liquid used in the developing process is discarded after use.

Further, the substrate cleaning process and the developing process have different demands for cleanliness of the treating liquid. Generally, the level of cleanliness required in the developing process is lower than that in the substrate cleaning process. Thus when new treating liquid is used in the developing process and then discarded, this is considered by many to be wastage of treating liquid.

What is needed, therefore, is a new apparatus for processing substrates which overcomes the above-described problems. What is also needed is a new method involving such apparatus.

SUMMARY

In one embodiment, an apparatus for processing substrates comprises: a substrate cleaning device, which cleans the substrates with treating liquid; a developing device; and a treating liquid recovery system, which is connected with the cleaning device and the developing device. The treating liquid recovery system can convey the treating liquid from the cleaning device to the developing device.

The treating liquid, which has been used in the cleaning device, can be reused in the developing device. That is, the apparatus for processing substrates can reuse the treating liquid. Therefore the apparatus for processing substrates can economize on treating liquid and reduce costs.

Other advantages and novel features will become more apparent from the following detailed description when taken in conjunction with the accompanying drawings.

DETAILED DESCRIPTION OF PREFERRED EMBODIMENTS

Figure 1:
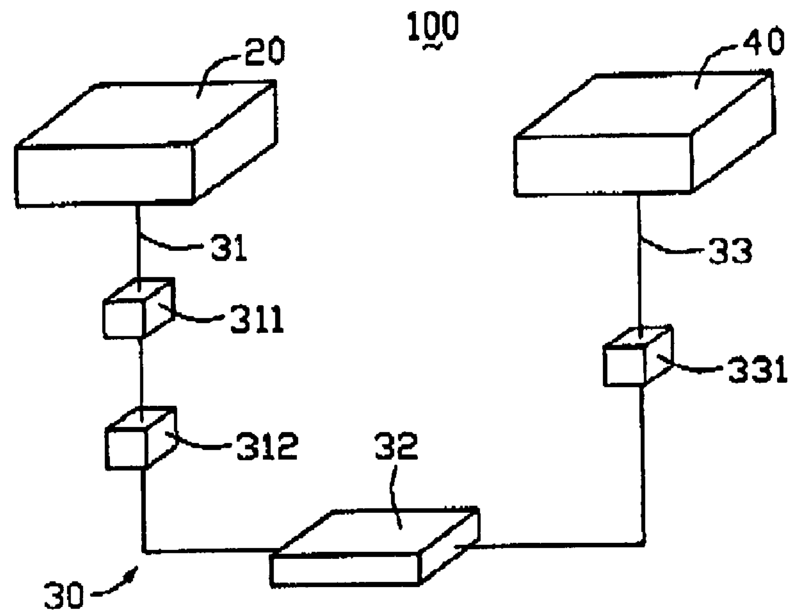
FIG. 1 is a schematic diagram of an apparatus for processing substrates according to an exemplary embodiment of the present invention.

Referring to FIG. 1, an apparatus for processing substrates according to an exemplary embodiment of the present invention is shown. The apparatus 100 for processing substrates includes a substrate cleaning device 20, a developing device 40, and a treating liquid recovery system 30.

The cleaning device 20 is utilized to clean each substrate. The developing device 40 is utilized to develop the substrate after the substrate has been exposed, and then to clean the substrate. The treating liquid recovery system 30 is utilized to collect treating liquid that has been used in the cleaning device 20, and then convey the treating liquid to the developing device 40 for use again.

The treating liquid recovery system 30 includes a receiving pipe 31, a receiving container 32, and an exporting pipe 33. The receiving pipe 31 is connected with the cleaning device 20, and is used to collect the treating liquid that has been used in the cleaning device 20 to the receiving container 32. The exporting pipe 33 is connected with the developing device 40, and conveys the treating liquid from the receiving container 32 to the developing device 40.

The treating liquid recovery system 30 also includes a removing device 311. The removing device 311 can remove carbon dioxide from the treating liquid. The removing device 311 is set between the receiving pipe 31 and the receiving container 32.

The treating liquid recovery system 30 also includes a filtering device 312. The filtering device 312 can remove impurities from the treating liquid. The filtering device 312 is connected between the removing device 311 and the receiving container 32.

A rate of flow of the treating liquid in the cleaning device 20 is higher than a rate of flow of the treating liquid in the developing device 40. Typically, the rate of flow of the treating liquid in the cleaning device 20 is two to three times that of the treating liquid in the developing device 40. Therefore, the flow of the treating liquid from the receiving container 32 must be controlled. This is accomplished by way of the treating liquid recovery system 30 having a flow control device 331. The flow control device 331 is set between the receiving container 32 and the developing device 40.

The removing device 311 and the filtering device 312 are not limited to the above-described positions. The removing and filtering devices 311, 312 can be set anywhere along the path between the cleaning device 20 and the developing device 40. Whatever configuration is adopted, the removing and filtering devices 311, 312 can remove carbon dioxide and impurities from the treating liquid before the treating liquid enters the developing device 40.

Figure 2:
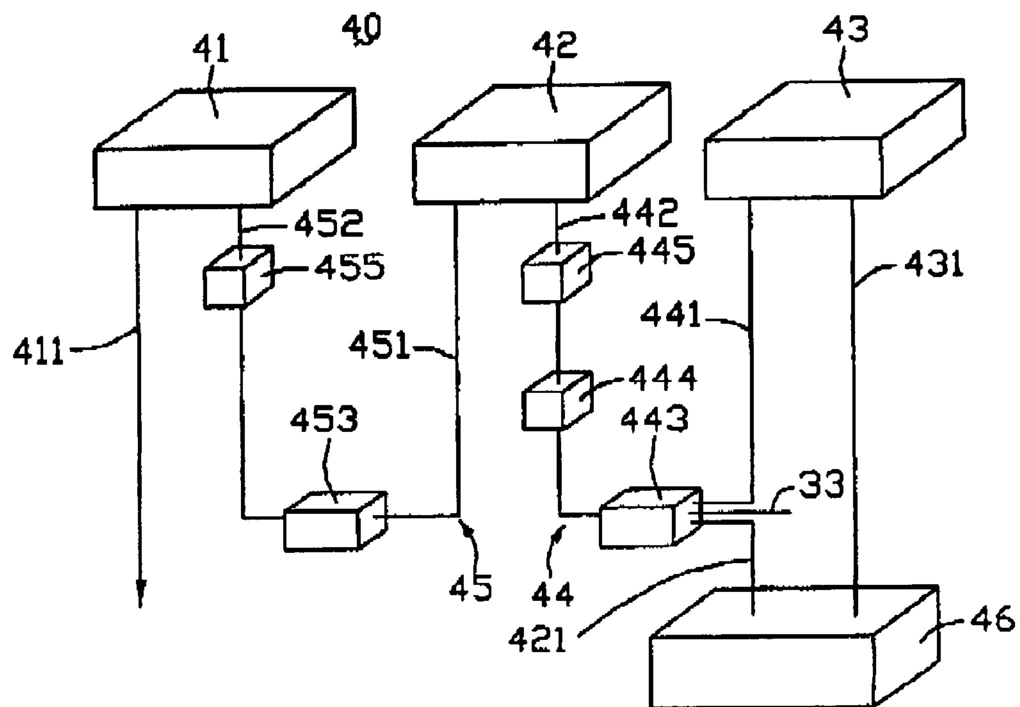
FIG. 2 is a schematic diagram of a developing device of the apparatus of FIG. 1.
Figure 3:
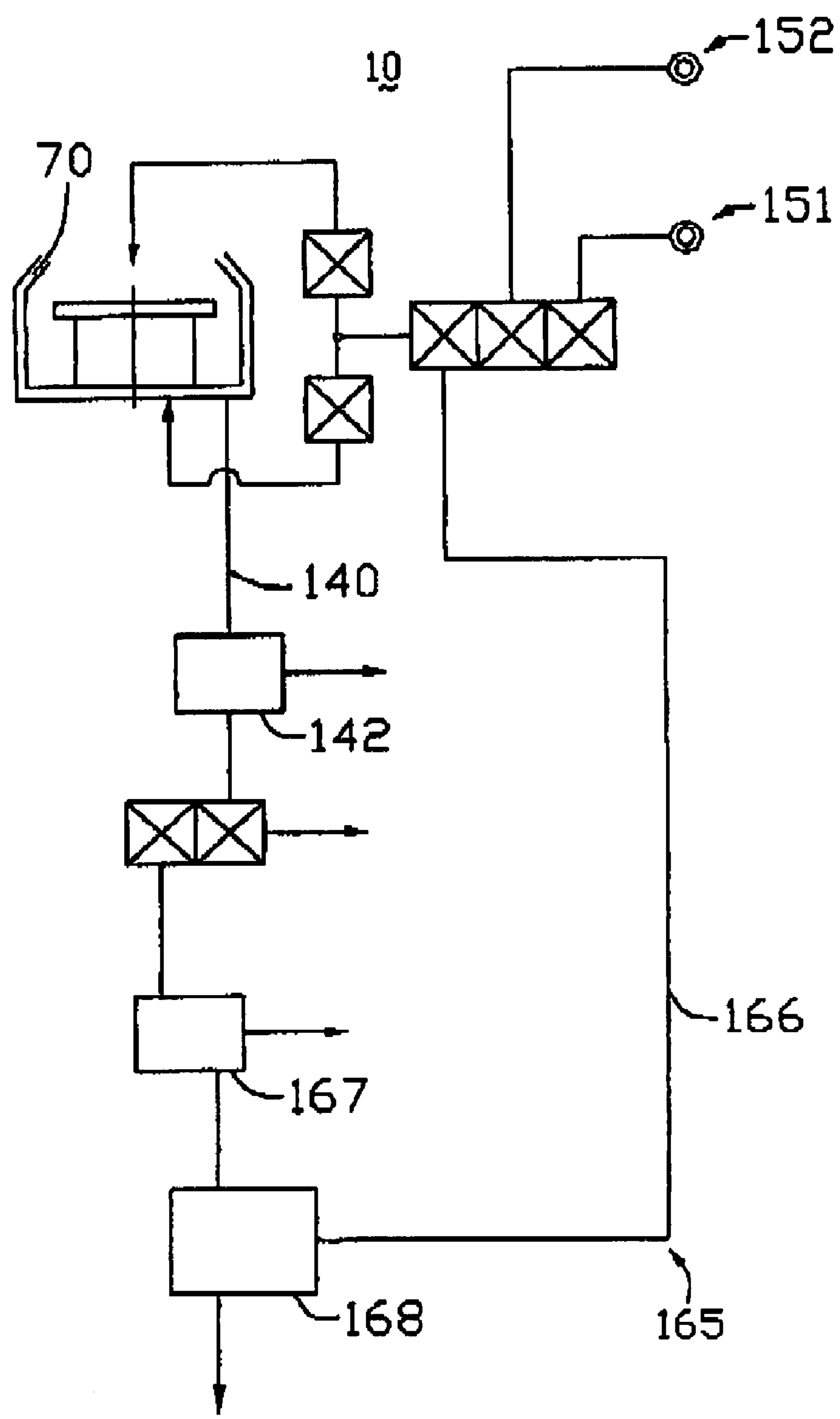
FIG. 3 is a schematic diagram of a conventional apparatus for processing substrates.

Referring to FIG. 2, a structure of the developing device 40 is shown. The developing device 40 includes a developing part (not shown), a transpositional cleaning part 41, a back cleaning part 43, and a cleaning part 42.

A first treating liquid recovery system 44 is set between the cleaning part 42 and the back cleaning part 43. A second treating liquid recovery system 45 is set between the cleaning part 42 and the transpositional cleaning part 41. The first treating liquid recovery system 44 can convey the treating liquid from the treating liquid recovery system 30, and convey the treating liquid from the back cleaning part 43 to the cleaning part 42 for reuse. The second treating liquid recovery system 45 can convey the treating liquid from the cleaning part 42 to the transpositional cleaning part 41 for reuse.

The first treating liquid recovery system 44 has a first receiving container 443 for receiving the treating liquid. The first receiving container 443 is connected with the back cleaning part 43 through a first receiving pipe 441. Thus the first receiving container 443 can receive the treating liquid that has been used in the back cleaning part 43. The first receiving container 443 is also connected with the treating liquid recovery system 30 through the exporting pipe 33. Thus the first receiving container 443 can receive the treating liquid that has been used in the cleaning device 20.

When the cleaning device 20 is not operating, there is no treating liquid conveyed from the cleaning device 20 to the developing device 40 through the exporting pipe 33. Thus the developing device 40 does not have treating liquid available for cleaning. Therefore, the developing device 40 has a treating liquid providing device 46. The treating liquid providing device 46 is connected with the first receiving container 443 through a first providing pipe 421. The treating liquid providing device 46 is also connected with the back cleaning part 43 through a second providing pipe 431.

Therefore, the first receiving container 443 can receive the treating liquid that has been used in the cleaning device 20, the treating liquid that has been used in the back cleaning part 43, and the new treating liquid available from the treating liquid providing device 46.

The first receiving container 443 is connected with the cleaning part 42 through a first exporting pipe 442. Thus the treating liquid that the first receiving container 443 has received can be utilized to clean substrates in the cleaning part 42.

A first filtering device 444 and a second filtering device 445 are provided between the cleaning part 42 and the first receiving container 443. The first and second filtering devices 444, 445 can remove impurities from the treating liquid before the treating liquid enters the cleaning part 42. The first filtering device 444 and the second filtering device 445 have plural filtering holes. The filtering holes of the first filtering device 444 are larger than the filtering holes of the second filtering device 445. Thus the second filtering device 445 can remove small impurities not removed by the first filtering device 444.

The second treating liquid recovery system 45 has a second receiving container 453. The second receiving container 453 is connected with the cleaning part 42 through a second receiving pipe 451. The second receiving container 453 is connected with the transpositional cleaning part 41 through a second exporting pipe 452.

Therefore, the second treating liquid recovery system 45 can convey the treating liquid that has been used in the cleaning part 42 to the transpositional cleaning part 41 for reuse.

The second treating liquid recovery system 45 also has a filtering device 455. The filtering device 455 is set between the transpositional cleaning part 41 and the second receiving container 453. The filtering device 455 can remove impurities from the treating liquid. Thus the transpositional cleaning part 41 can use the duly filtered treating liquid.

The transpositional cleaning part 41 is connected with a venting pipe 411, for venting of the treating liquid.

In summary, the treating liquid that has been used in the cleaning device 20 can be reused in the developing device 40. Thus the apparatus 100 can use the treating liquid again and again. Further, in the developing device 40, the treating liquid is also used again and again. Therefore the apparatus 100 can economize on the treating liquid and reduce costs.

It is to be further understood that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An apparatus for processing substrates, comprising:

a cleaning device, which cleans the substrates with a treating liquid;

a developing device; and a treating liquid recovery system comprising a receiving container and a control device, the receiving container being connected with the cleaning device through a receiving pipe and being connected with the developing device through an exporting pipe, the control device being connected with the exporting pipe, wherein the treating liquid recovery system is configured to convey the treating liquid from the cleaning device to the developing device, and the control device is configured for controlling the flow of the treating liquid.

2. The apparatus for processing substrates as claimed in claim 1, wherein the treating liquid recovery system comprises a carbon dioxide removing device, and the carbon dioxide removing device is connected with the receiving pipe.

3. The apparatus for processing substrates as claimed in claim 1, wherein the treating liquid recovery system further comprises a filtering device which can remove impurities, and the filtering device is connected with the receiving pipe.

4. The apparatus for processing substrates as claimed in claim 1, wherein the developing device comprises a transpositional cleaning part, a cleaning part, and a back cleaning part.

5. The apparatus for processing substrates as claimed in claim 4, wherein the developing device further comprises a first treating liquid recovery system, and the first treating liquid recovery system is connected with the back cleaning part and the cleaning part.

6. The apparatus for processing substrates as claimed in claim 5, wherein the first treating liquid recovery system comprises a first receiving container, and the first receiving container is set between the cleaning part and the back cleaning part.

7. The apparatus for processing substrates as claimed in claim 6, wherein the developing device further comprises a treating liquid providing device, and the treating liquid providing device is connected with the first receiving container.

8. The apparatus for processing substrates as claimed in claim 5, wherein the first treating liquid recovery system comprises a first filtering device and a second filtering device.

9. The apparatus for processing substrates as claimed in claim 8, wherein the first filtering device and the second filtering device have plural filtering holes, and the filtering holes of the first filtering device are larger than the filtering holes of the second filtering device.

10. The apparatus for processing substrates as claimed in claim 4, wherein the developing device further comprises a second treating liquid recovery system, and the second treating liquid recovery system is connected with the cleaning part and the transpositional cleaning part.

11. The apparatus for processing substrates as claimed in claim 10, wherein the second treating liquid recovery system comprises a second receiving container.

12. The apparatus for processing substrates as claimed in claim 10, wherein the second treating liquid recovery system comprises a filtering device.

13. A method for processing a substrate, comprising;

cleaning a substrate with a cleaning device;

forming a photoresist layer on the substrate;

exposing the photoresist layer; and developing the exposed photoresist layer with a developing device;

wherein a treating liquid recovery system comprising a control device is provided between the cleaning device and the developing device, the treating liquid recovery system is connected with the cleaning device and the developing device, the treating liquid recovery system is configured to convey treating liquid from the cleaning device to the developing device, and a flow of the treating liquid conveyed from the cleaning device to the developing device is controlled by the control device.

* * * * *